United States Patent
Tateno et al.

(10) Patent No.: US 9,741,859 B2
(45) Date of Patent: Aug. 22, 2017

(54) SEMICONDUCTOR DEVICE WITH GRAPHENE LAYER AS CHANNEL

(71) Applicants: Sumitomo Electric Industries, Ltd., Osaka-shi (JP); Tohoku University, Sendai-shi (JP)

(72) Inventors: Yasunori Tateno, Yokohama (JP); Maki Suemitsu, Sendai (JP); Hirokazu Fukidome, Sendai (JP)

(73) Assignees: Sumitomo Electric Industries, Ltd., Osaka-shi (JP); Tohoku University, Sendai-shi (JP)

( * ) Notice: Subject to any disclaimer, the term of this patent is extended or adjusted under 35 U.S.C. 154(b) by 0 days.

(21) Appl. No.: 14/844,996

(22) Filed: Sep. 3, 2015

(65) Prior Publication Data
US 2016/0071982 A1 Mar. 10, 2016

(30) Foreign Application Priority Data
Sep. 5, 2014 (JP) .................................. 2014-181575

(51) Int. Cl.
*H01L 29/786* (2006.01)
*H01L 29/16* (2006.01)
*H01L 29/66* (2006.01)

(52) U.S. Cl.
CPC .... *H01L 29/78645* (2013.01); *H01L 29/1606* (2013.01); *H01L 29/66484* (2013.01); *H01L 29/66742* (2013.01); *H01L 29/78684* (2013.01)

(58) Field of Classification Search
CPC ........... H01L 29/1606; H01L 29/78645; H01L 29/66484; H01L 29/78684; H01L 29/1608
See application file for complete search history.

(56) References Cited

U.S. PATENT DOCUMENTS

| | | | |
|---|---|---|---|
| 2011/0089995 A1* | 4/2011 | Heo ..................... | H01L 29/1606 327/534 |
| 2011/0220865 A1 | 9/2011 | Miyata et al. | |
| 2012/0228773 A1* | 9/2012 | Brown ............. | H01L 21/28088 257/761 |
| 2013/0189444 A1* | 7/2013 | Kub .................... | C01B 31/0446 427/523 |

(Continued)

FOREIGN PATENT DOCUMENTS

JP  2011-192667 A  9/2011

OTHER PUBLICATIONS

Henri Jussila, He Yang, Niko Granqvist, and Zhipei Sun, "Surface plasmon resonance for characterization of large-area atomic-layer graphene film," Optica 3, 151-158 (2016).*

(Continued)

*Primary Examiner* — Tom Thomas
*Assistant Examiner* — John Bodnar
(74) *Attorney, Agent, or Firm* — Venable LLP; Michael A. Sartori; F. Brock Riggs (57) ABSTRACT

A field effect transistor (FET) with a graphene layer as a channel layer is disclosed. The FET provides two gate electrodes, one of which receives the gate bias, while, the other receives a reference bias. An intermediate electrode made of ohmic metal to the graphene layer is provided between the two gate electrodes. The second gate electrode receiving the reference bias suppresses the hole injection into the channel beneath the first gate electrode.

9 Claims, 8 Drawing Sheets

(56) References Cited

U.S. PATENT DOCUMENTS

| | | | |
|---|---|---|---|
| 2013/0240984 A1* | 9/2013 | Cheng | H01L 21/2815 257/330 |
| 2014/0176186 A1* | 6/2014 | Lee | H01L 29/1606 326/38 |
| 2014/0332852 A1* | 11/2014 | Dewey | B82Y 10/00 257/192 |

OTHER PUBLICATIONS

Gu et al "Field Effect in Epitaxial Graphene on a Silicon Carbide Substrate," Applied Physics Letters, 2007, pp. 253507-1-253507-3, vol. 90.*

Peter Sutter, "How Silicon Leaves the Scene," Natural Matls., vol. 8, Mar. 2009, pp. 171-172.*

Schwierz F., "Graphene Transistors: Status, Prospects, and Problems", Proceedings of the IEEE, vol. 101, Issue 7, pp. 1567-1584 (2013).

* cited by examiner

SEMICONDUCTOR DEVICE WITH GRAPHENE LAYER AS CHANNEL

CROSS-REFERENCE TO RELATED APPLICATION

This application is based upon and claims the benefit of priority of the prior Japanese Patent Application No. 2014-181575, filed on Sep. 5, 2014, the entire contents of which are incorporated herein by reference.

BACKGROUND OF THE INVENTION

1. Field of the Invention

The present application relates to a semiconductor device, in particular, the semiconductor device including a graphene layer as the channel.

2. Background Arts

A graphene is well known material where a number of benzene ring infinitely extends in two dimensional. Because the graphene shows extremely high electron mobility, various prior arts have reported a transistor having a graphene as the channel thereof. However, such a transistor inherently shows an excellent cut-off frequency ft but the maximum oscillation frequency fmax thereof has been unexpectedly inferior.

SUMMARY OF THE INVENTION

An aspect of the present application relates to a field effect transistor (FET) that comprises a substrate; a graphene layer operating as the channel of the FET, the graphene layer being provided on the substrate; source electrode and drain electrode provided on the graphene layer; and first and second electrodes on the graphene layer. In the present FET, the first gate electrode is disposed closer to the source electrode, while, the second gate electrode is disposed closer to the drain electrode. The second gate electrode effectively suppresses the hole injection into the channel of the graphene layer.

Another aspect of the present application relates to a method to produce an FET with a graphene layer as the channel. The method includes steps of: (1) thermally treating a substrate made of silicon carbide (SiC) or silicon (Si) substrate with an SiC epitaxial layer, which forms a graphene layer; (2) forming aluminum (Al) on the graphene layer; (3) oxidizing Al; (4) forming first and second gate electrodes on the oxidized Al layer; and (5) forming source and drain electrodes in respective sides of the first and second gate electrodes, and an intermediate electrode between the first and second gate electrode.

BRIEF DESCRIPTION OF DRAWINGS

A more detailed understanding may be obtained from the following description, given by way of example in conjunction with the accompanying drawings, wherein.

DESCRIPTION OF EMBODIMENTS

Some preferred embodiments according to the present application will be described as referring to drawings. The present invention, however, is not restricted to those embodiments. The present invention is directed to include subjects claimed in claims, modifications and equivalents thereof.

Figure 1:
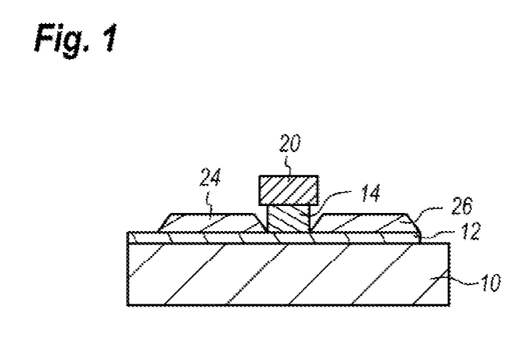
FIG. 1 shows a cross section of an FET according to a comparable example of the present application.

Reasons to degrade the maximum frequency of oscillation fmax is first considered. FIG. 1 shows a cross section of a field effect transistor (FET) according of a comparable example comparable to the present invention. As shown in FIG. 1, the FET provides a graphene layer 12 on a substrate 10. The substrate 10 may be made if silicon carbide (SiC). Provided on the graphene layer 12 is a gate electrode 20 interposing with a gate insulating film 14, and a source electrode 24 and a drain electrode 26 putting the gate electrode 20 therebetween.

Figure 2:
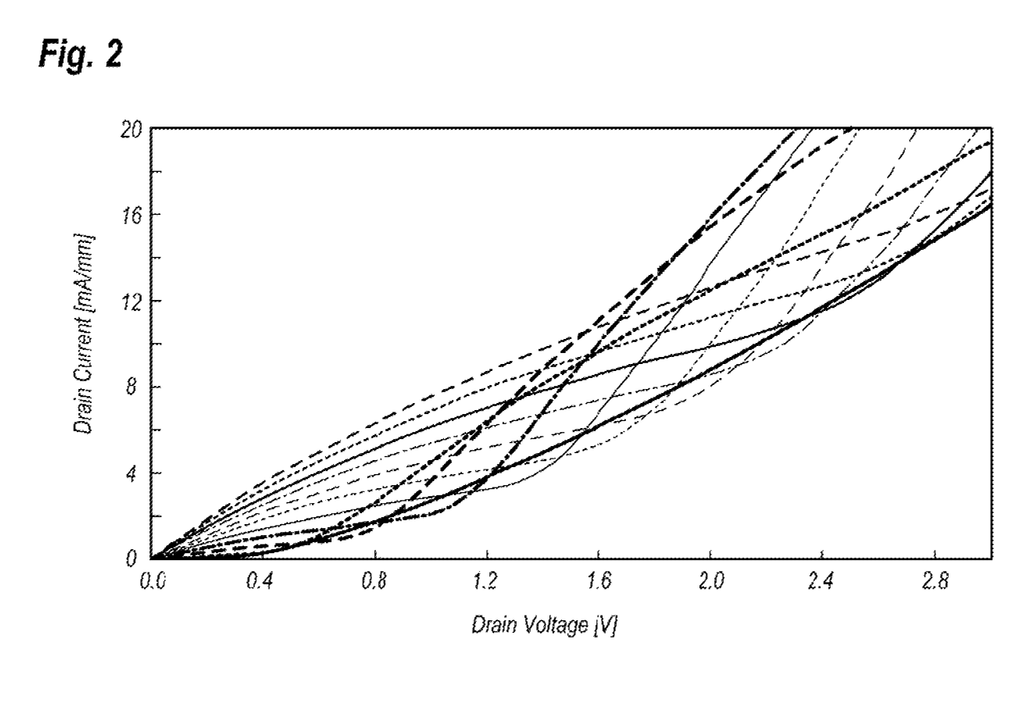
FIG. 2 shows the drain current characteristic of the FET shown in FIG. 1.

The operation of the FET shown in FIG. 1 is analyzed. An FET, on the SiC substrate 10, with the graphene layer 12 with a thickness of 0.35 nm and a composite layer including an aluminum oxide film with a thickness of 5 nm and a silicon oxide film with a thickness of 30 nm as the gate insulating film 14 is assumed. The FET above has a gate length of 3.0 μm. FIG. 2 shows behaviors of the drain current against drain voltages with a gate bias form 0 to 5V by a step of 0.5V as a parameter. As shown in FIG. 2, the FET shows not saturation performance and extremely degraded drain conductance given by $\Delta Id/\Delta Vd$, where $\Delta Id$ is a variation of the drain current and $\Delta Vd$ is that of the drain voltage. Specifically, the drain current increases when the drain voltage exceeds 0.4 V. The maximum oscillation frequency fmax degrades as increasing the drain conductance. Thus, the reason why the FET comparable with the comparable example shows an inferior fmax is the degraded drain conductance.

Figure 3A:
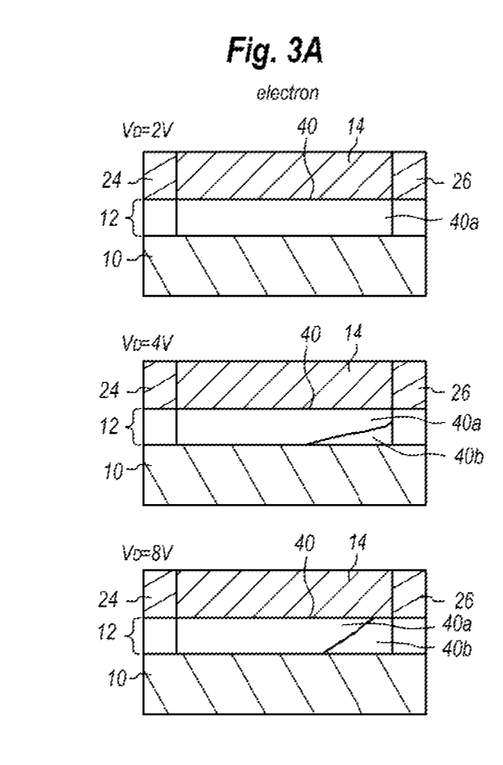
FIGS. 3A and 3B schematically show the electron distribution and the hole distribution, respectively, in the channel as the drain bias increases.
Figure 3B:
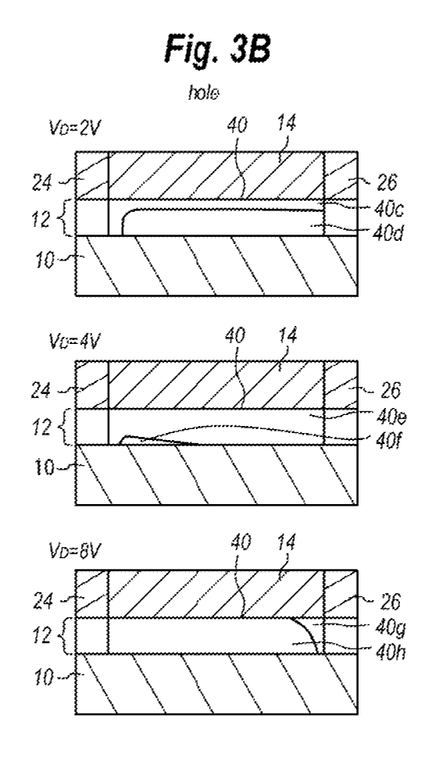

The electron distribution and that of the hole are analyzed for various drain voltages VD in the FET of the comparable example. FIGS. 3A to 3B show the electron distribution and the hole distribution under the drain voltages VD of 2, 4, and 8V, respectively, when the gate bias of 1 V is assumed. A channel 40 is induced within the graphene layer 12 between the SiC substrate 10 and the gate insulating film 14. When the drain voltage VD is 2V, the channel 40 is almost occupied by an area 40a with the electron concentration of about $1\times10^{20}$ cm$^{-3}$. When the drain voltage VD is 4 V, an area 40b having the electron concentration of $1\times10^{19}$ cm$^{-3}$ appears in the side of the drain electrode 26, and this area 40b expands in the drain voltage VD of 8 V.

On the other hand, an area 40c of the hole concentration of $1\times10^{15}$ cm$^{-3}$ and an area 40d of the hole concentration of $1\times10^{16}$ cm$^{-3}$ appears in the side closer to the gate insulating film 14 and closer to the substrate 10, respectively, at the drain voltage VD of 2 V. Increasing the drain voltage VD to 4 V, almost all channel 40 is filled with an area 40e with the hole concentration of $1\times10^{17}$ cm$^{-3}$, and an area deep in the source electrode 24 appears with the hole concentration of $1\times10^{18}$ cm$^{-3}$. When the drain voltage VD increases to 8V, an area 40g with the hole concentration of $1\times10^{19}$ cm$^{-3}$ appears in a portion closer to the drain electrode 26 and the channel 40 is almost filled with an area 40h with the hole concentration of $1\times10^{20}$ cm$^{-3}$.

An FET saturates the drain current when the drain voltage becomes large and the area 40b with smaller electron concentration, which is generally called as the depletion layer, is formed. However, the FET shown increased the hole concentration as the drain voltage increases. Accordingly, the drain current does not saturate even when the drain voltage increases because the hole concentration within the channel 40 is substance, which causes the increase of the drain current due to the hole, and degrades the drain conductance.

First Embodiment

Figure 4:
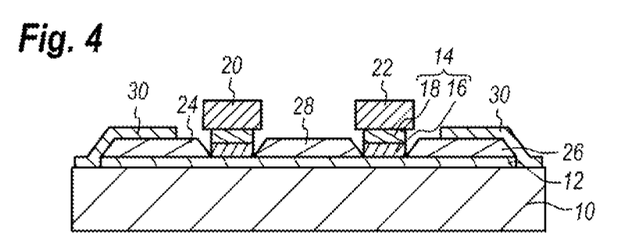
FIG. 4 shows a cross section of an FET according to a first embodiment of the present application.

FIG. 4 shows a cross section of an FET according to the first embodiment of the present application. The FET shown in FIG. 4 provides a graphene layer 12 on a substrate 10. The graphene layer 12 except for an active layer, showing no contribution to an operation of an FET, is removed. Provided on the graphene layer 12 are a source electrode 24 and a drain electrode 26, and two gate electrodes, namely the first gate electrode 20 and the second gate electrode 22, between the source electrode 24 and the drain electrode 26 interposing with a gate insulating film 14. The gate insulating film 14 includes an aluminum oxide film 16 on the graphene layer 12 and a silicon oxide film 18 on the aluminum oxide film 16. Features of the FET according to the first embodiment are that a gate electrode is divided into two parts as described above and an intermediate electrode 28 showing no rectifier characteristic is formed between the two gate electrodes, 20 and 22. The source and drain electrodes, 24 and 26, respectively accompany with pads or interconnections to pads to provide biases to the source and drain electrodes, 24 and 26.

Figure 5A:
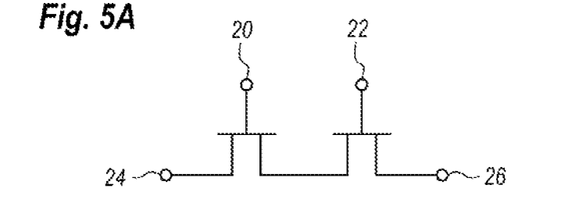
FIG. 5A shows an equivalent circuit diagram of the FET shown in FIG. 4.

FIGS. 5A and 5B show equivalent circuit diagrams of the FET shown in FIG. 4. As shown in FIG. 5A, the FET of the first embodiment provides two transistor elements connected in series, specifically, the two transistor elements have a common electrode between respective the two gate electrodes, 20 and 22. One of the two gate electrodes 20 closer to the source electrode 24 receives the gate bias, while, the other gate electrode 22 receives a reference bias. Adjusting the reference bias, the hole injection into the channel 40 under the first gate electrode 20 may be suppressed, which means that the reference bias applied to the second gate electrode 22 may saturate the drain current and suppress the drain conductance to enhance the maximum oscillation frequency fmax.

Figure 5B:
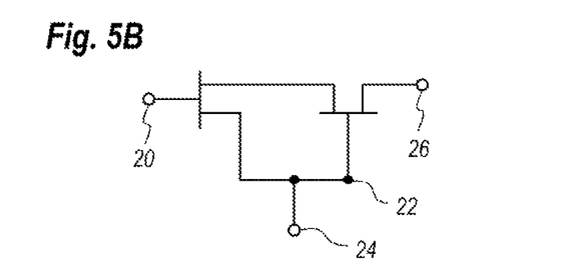
FIG. 5B shows an example of a circuit diagram of the FET shown in FIG. 4.

One example of the reference bias is shown in FIG. 5B, that is, connecting the second gate electrode 22 to the source electrode 24, the reference bias is set to be equal to the source bias, the hole injection from the drain electrode 26 of the channel 40 beneath the first gate electrode 20 may be effectively suppressed. The reference level is preferable to be greater than the gate bias applied to the first gate electrode 20 to enhance the suppression of the hole injection into the channel 40.

Next, a process to produce the FET of the first embodiment shown in FIG. 4 will be described. FIGS. 6A to 7E show processes to produce the FET of the first embodiment. First, a surface of a substrate 10 made of 6H-SiC (hexagonal silicon carbide) is cleaned by sequential processes of dipping within acetone for 5 minutes, within ethanol for 5 minutes, and within purified water for 5 minutes. A conventional RCA clean may be replaced to the sequential processes described above. Also, the substrate 10 may be a silicon substrate with a SiC layer thereon. Topmost layer of the substrate 10 is necessary to be SiC layer when the graphene layer 12 is formed by sublimating SiC, but is optional when the graphene layer 12 is formed by the chemical vapor deposition (CVD).

Figure 6A:
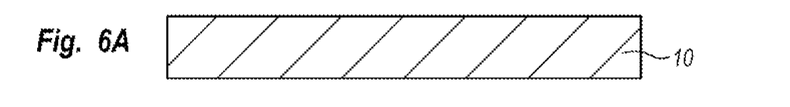
FIGS. 6A to 6E show processes to produce the FET of the first embodiment of the present application.
Figure 6B:
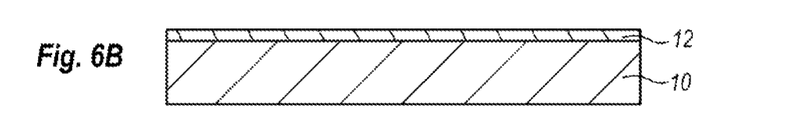

In the present process, the sublimation is used for obtaining the graphene layer 12 on the SiC substrate 10, as shown in FIG. 6B. Specifically, thermally treating the SiC substrate 10 at 1600° C. for one minute, the graphene layer 12 is obtained on the SiC substrate 10 with a thickness of 0.35 to 0.7 nm. Exposing the SiC substrate 10 in a high temperature, Si atoms selectively sublimates and left C atoms combine through the SP2 orbital. The temperature, the atmosphere, and the time of the thermal treatment of the SiC substrate 10 are optional to be decided depending on the thickness and the quality of the graphene layer 12. For instance, the thermal treatment of the SiC substrate 10 may be carried out within in a vacuum, without any intentionally provided gases. In order to obtain a thinner graphene layer 12, the thermal treatment of the SiC substrate 10 is preferably to be performed within an atmosphere of inert gasses to make the growth rate of the graphene layer 12 small.

Figure 6C:
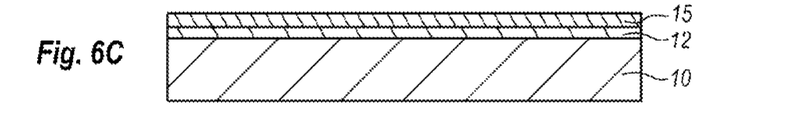
Figure 6D:
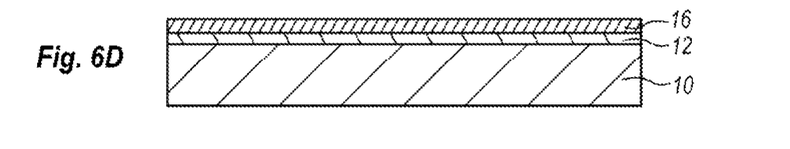

Then, the process forms an aluminum (Al) layer 15 with a thickness of 5 nm by the metal evaporation or the metal sputtering on the graphene layer 12, as shown in FIG. 6C. Subsequently, the deposited Al layer 15 is exposed to air for about 24 hours, which naturally oxides the Al layer 15 to convert into the aluminum oxide ($Al_2O_3$) film 16 on the graphene layer 12, as shown in FIG. 6D. Other techniques to obtain the gate insulating film 14 may be applicable; for instance, an aluminum oxide film obtained by oxidizing Al with techniques except for the natural oxidization above described, or other materials except for aluminum oxide. A silicon oxide (SiO) film formed by the CVD method, an aluminum oxide film formed by the atomic layer deposition (ALD) technique, the aluminum oxide film formed by the natural oxidization were practically investigated. Analyzing the graphene layer 12 by Raman spectroscopy and the gate insulating film 14 through the leak current; the last method, namely, the aluminum oxide film obtained by the natural oxidization, showed the highest quality.

Figure 6E:
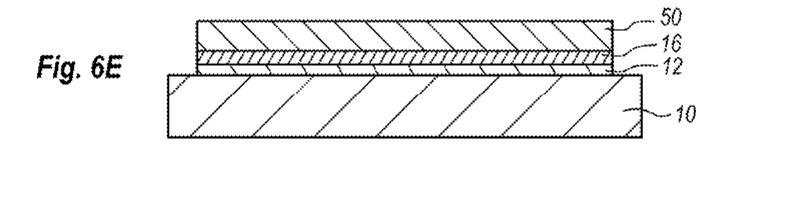

Next, a conventional lithography process removes the graphene layer 12 and the aluminum oxide film 16 in areas except for the device region, as shown in FIG. 6E. Specifically, a photoresist 50 is provided on the whole surface of the aluminum oxide film 16, then, the exposure and the development leave the patterned photoresist 50 covering only the device region. During the development of the photoresist 50, an alkali developer may solve the aluminum oxide film 16 in the device region. The graphene layer 12 is removed by oxygen plasma. Because the oxygen plasma not only removes the graphene layer 12 but the patterned photoresist 50, the conditions of the oxygen plasma become substantial. The first embodiment selectively W removes the graphene layer 12 exposed from the patterned photoresist 50 by conditions of the pressure of 4 Pa and the RF (radio frequency) power of 200 W.

Figure 7A:
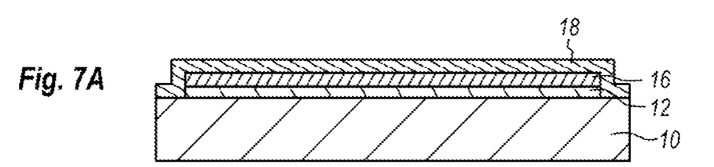
FIGS. 7A to 7E show processes subsequent to the process shown in FIG. 6E to produce the FET of the first embodiment.

Then, the substrate 10 and the aluminum oxide film 16 are covered with a silicon oxide (SiO) film 18 with a thickness of 30 nm, as shown in FIG. 7A. The silicon oxide film 18 may be formed by the CVD method. The silicon oxide film 18 is provided to thicken the gate insulating film 14. The aluminum oxide film 16 is hard to be formed thicker. On the other hand, a thicker gate insulating film 14 is preferable to prevent the short circuit between the first and second gate electrodes, 20 and 22, and the drain, source, and intermediate electrodes, 24 to 28. Accordingly, the FET of the first embodiment provides the composite gate insulating film 14 including the thin aluminum oxide film 16 and the thick silicon oxide film 18. Other materials substituted for the silicon oxide film 18 may be considered. However, due to the dielectric constant and the productivity, the silicon oxide film 18 is preferably selected.

Figure 7B:
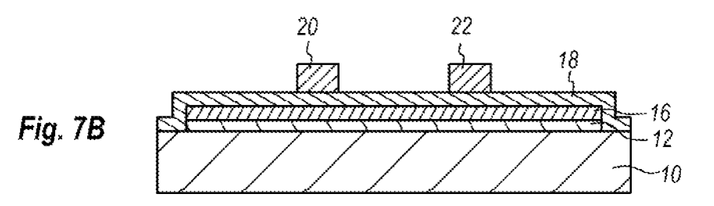

Next, as shown in FIG. 7B, the first and second gate electrodes, 20 and 22, are formed by the metal evaporation and the subsequent lift-off technique. The two gate electrodes, 20 and 22, have a stack of titanium (Ti) layer with a thickness of 10 nm and gold (Au) layer of a thickness of 100 nm on the Ti layer. First metals except for Ti may be applicable, and second metals except for Au may be also applicable. From a viewpoint of low gate resistance, a metal with higher conductivity, smaller resistivity, are preferable. Also, the two-gate electrodes, 20 and 22, may be formed independently, and may have metals different from others. However, the two gate electrodes, 20 and 22, are preferably formed at the same time and preferably have the same arrangement from the viewpoint of the productivity.

Figure 7C:
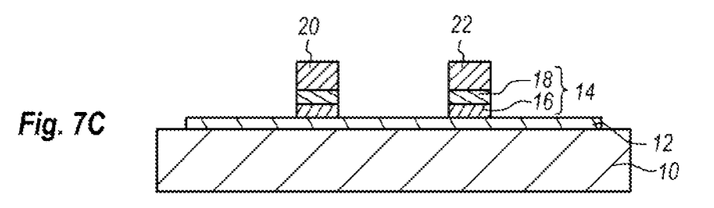
Figure 7D:
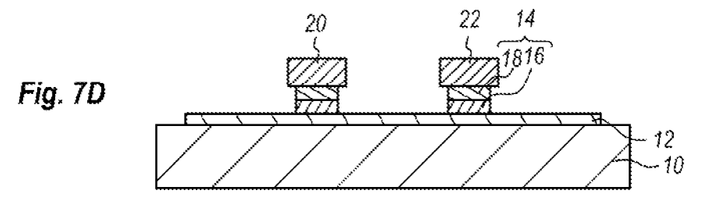

The process next removes the silicon oxide film 18 and the aluminum oxide film 16 by the dry etching to obtain the gate insulating film 14, as shown in FIG. 7C. The gate insulating film 14 is side etched by a buffered fluoric acid. The buffered fluoric acid may etch not only the silicon oxide film 18 but the aluminum oxide film 16. As shown in FIG. 7D, the etching may form T-shaped gates for the first and second gate electrodes, 20 and 22. The T-shaped form may effectively prevent the two gate electrodes, 20 and 22, from making short-circuits to the source, drain, and intermediate electrodes, 24 to 28.

Figure 7E:
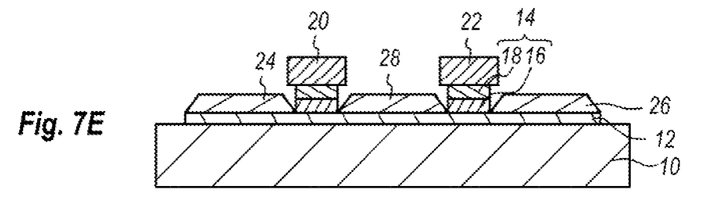

Then, as shown in FIG. 7E, the source, drain, and intermediate electrodes, 24 to 28, may be formed as being self-aligned with the first and second gate electrodes, 20 and 22, respectively, by the metal evaporation and the subsequent lift-off technique. The source, drain, and intermediate electrodes, 24 to 28, may be a mono-layer made of nickel (Ni). Also, the evaporation of nickel may be carried out in isotropic so as not to expose the surface of the graphene layer 12. Because the nickel of the gate metal forms the overhang with respect to the gate insulating film 14, and the gate insulating film 14 has the thickness greater than the thickness of the source, drain, and intermediate electrodes, 24 to 28, which may effectively prevent the two gate electrodes, 20 and 22, from making the short circuit to the source, drain, and intermediate electrodes, 24 to 28.

Finally, an interconnections 30 are formed on the source and drain electrodes, 24 and 26, by the metal evaporation and the subsequent lift-off technique. The interconnection 30 may have a stack of titanium (Ti) film with a thickness of 10 nm and gold (Au) film with a thickness of 100 nm. Thus, the FET shown in FIG. 4 is completed.

The performance of the FET thus formed is evaluated. The FET under evaluated has the gate length of 3.0 μm for the first and second gate electrodes, 20 and 22, and the intermediate electrode 28 has a length of 1.0 μm. Other arrangements are same as those explained in connection with FIG. 4.

Figure 8:
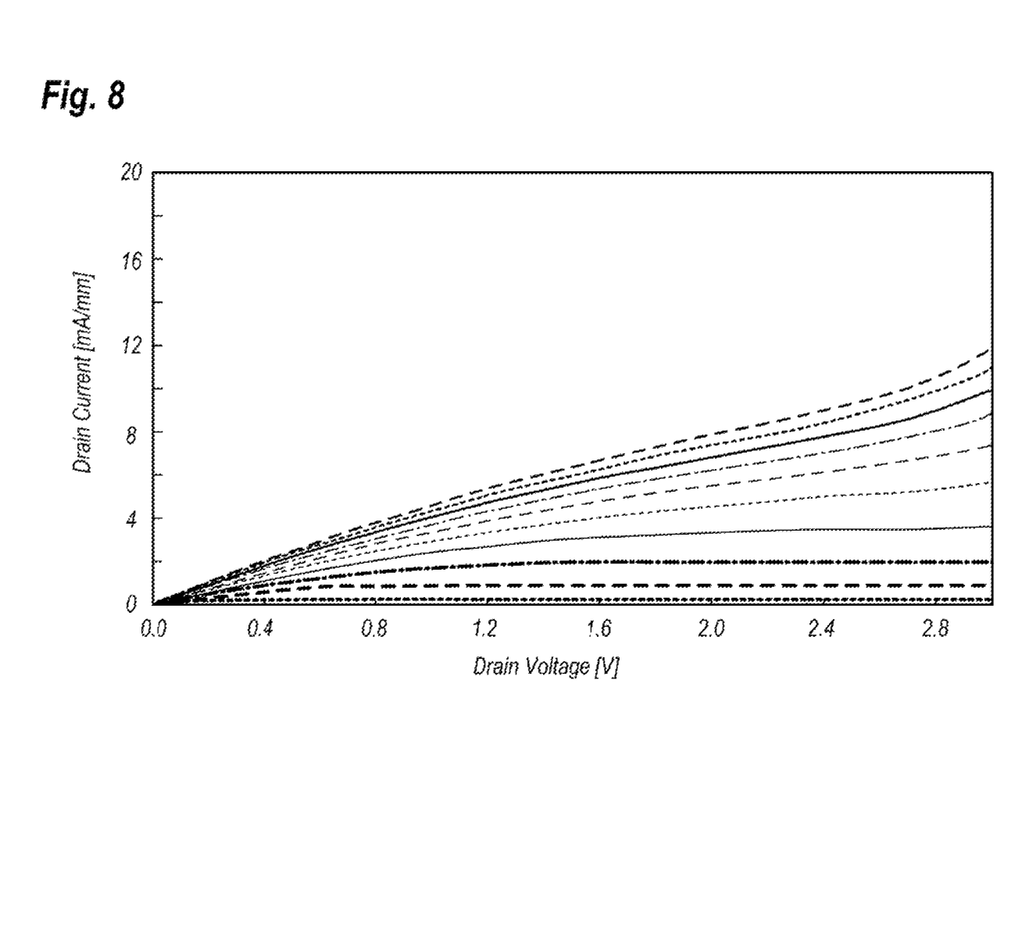
FIG. 8 shows the drain current characteristic of the FET of the first embodiment.

FIG. 8 shows the drain current characteristic against the drain voltage as varying the gate bias from 0 to 5 V by a step of 0.5 V. Comparing the performance of the FET of the first embodiment with that shown in FIG. 2 for a comparable example comparable to the first embodiment; the drain current effectively saturates even in a range where the drain voltage exceeds 0.4 V, and the drain conductance in that range maintains smaller values, which means that the maximum oscillation frequency fmax may be higher.

The FET according to the first embodiment provides the first gate electrode 20 in the side of the source electrode 24, while, the second gate electrode 22 in the side of the drain electrode 26. The second gate electrode 22 effectively suppresses the hole injection into the channel 40 beneath the first gate electrode 20, which may effectively suppress the drain conductance and enhance the high frequency performance of the FET.

Also, providing a reference bias to the second gate electrode 22, the hole injection from the drain electrode 26 into the channel 40 may be also effectively suppressed. The reference bias is preferably higher than the gate bias applied to the first gate electrode 20. For instance, the second gate electrode 22 may be connected to the source electrode 24, which means the reference bias is equal to be a source bias.

When the graphene layer 12 in the surface thereof is exposed, the graphene layer 12 that operates as the channel for the FET is depleted and increases the resistance thereof. The intermediate electrode 28 is provided on the graphene layer 12 between the two gate electrodes, 20 and 22. The intermediate electrode 28 effectively suppresses the graphene layer 12 from being depleted and increasing the resistance thereof. The intermediate electrode 28 is preferably formed to cover the whole of the graphene layer 12 between the two gate electrodes, 20 and 22.

Also, the graphene layer 12 between the source electrode 24 and the first gate electrode 20, and the graphene layer 12 between the drain electrode 26 and the second gate electrode 22 may be fully covered, namely, not to be exposed to the atmosphere.

The FET of the first embodiment provides the aluminum oxide film 16 as the gate insulating film 14. The aluminum oxide film 16, which is formed by the natural oxidization of aluminum (Al), may effectively suppress the gate leak current, which enhances the performance of the FET of the first embodiment.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A field effect transistor (FET), comprising:
   a substrate;
   a graphene layer provided on the substrate;
   a gate insulating film provided on the graphene layer;
   a source electrode and a drain electrode each provided in contact with the graphene layer;
   a first gate electrode and a second gate electrode provided on the gate insulating film, the first gate electrode being disposed closer to the source electrode, the second gate electrode being disposed closer to the drain electrode; and
   an intermediate electrode provided between the first gate electrode and the second gate electrode and in contact with the graphene layer, a substance of the intermediate electrode, the source electrode and the drain electrode being identical.

2. The FET of claim 1,
   wherein the second gate electrode receives a reference bias higher than a gate bias supplied to the first gate electrode.

3. The FET of claim 2,
wherein the reference bias is equal to a bias applied to the source electrode.
4. The FET of claim 1,
wherein the gate insulating film includes an aluminum oxide film.
5. The FET of claim 4,
wherein the gate insulating film further includes a silicon oxide film provided on the aluminum oxide film.
6. The FET of claim 5,
wherein the aluminum oxide film has a thickness of 5 nm and the silicon oxide film has a thickness of 30 nm.
7. The FET of claim 4,
wherein the source electrode and the drain electrode have a thickness less than a thickness of the gate insulating film.
8. The FET of claim 1,
wherein the graphene layer has thickness of 0.35 to 0.7 nm.
9. The FET of claim 1,
wherein the substrate is made of SiC.

\* \* \* \* \*